US007741944B2

(12) United States Patent
Leghissa et al.

(10) Patent No.: US 7,741,944 B2
(45) Date of Patent: Jun. 22, 2010

(54) SADDLE-SHAPED COIL WINDING USING SUPERCONDUCTORS, AND METHOD FOR THE PRODUCTION THEREOF

(75) Inventors: Martino Leghissa, Wiesenthau (DE); Norbert Prölss, Wendelstein (DE)

(73) Assignee: Siemens Aktiengesellschaft, Munich (DE)

( * ) Notice: Subject to any disclaimer, the term of this patent is extended or adjusted under 35 U.S.C. 154(b) by 240 days.

(21) Appl. No.: 11/919,005

(22) PCT Filed: Apr. 18, 2006

(86) PCT No.: PCT/EP2006/061640

§ 371 (c)(1), (2), (4) Date: Oct. 22, 2007

(87) PCT Pub. No.: WO2006/111527

PCT Pub. Date: Oct. 26, 2006

(65) Prior Publication Data

US 2009/0058592 A1 Mar. 5, 2009

(30) Foreign Application Priority Data

Apr. 20, 2005 (DE) ....................... 10 2005 018 370
Feb. 28, 2006 (DE) ....................... 10 2006 009 250

(51) Int. Cl.
*H01F 27/28* (2006.01)
*H01L 39/24* (2006.01)
*C01G 3/00* (2006.01)
*H02K 1/00* (2006.01)

(52) U.S. Cl. ....................... 336/225; 336/180; 336/186; 29/599; 505/512; 505/211; 310/216

(58) Field of Classification Search ....................... None
See application file for complete search history.

(56) References Cited

U.S. PATENT DOCUMENTS 3,270,304 A * 8/1966 Hoppie ....................... 335/216

(Continued)

FOREIGN PATENT DOCUMENTS

DE 1 270 688 6/1968

(Continued)

OTHER PUBLICATIONS

IEEE Trans. Appl. Supercond., vol. 9, No. 2, Jun. 1999, S. 1197-1200.

(Continued)

*Primary Examiner*—Elvin G Enad
*Assistant Examiner*—Mangtin Lian
(74) *Attorney, Agent, or Firm*—Staas & Halsey LLP

(57) ABSTRACT

Disclosed is a saddle-shaped coil winding which is formed onto an outer tube surface from a planar race track-type coil shape so as to be provided with axially extending winding sections on the longitudinal side and winding sections that extend therebetween, are located on the front side, and form winding overhangs. The individual windings of the coil winding are to be formed with at least one band-shaped superconductor which comprises especially high $T_c$ superconductor material and whose narrow side faces the outer tube surface. In order to prevent unacceptable mechanical stresses of the conductor when forming the coil, the windings in the saddle shape have a circumferential length which is virtually unchanged from the length in the planar oil shape.

23 Claims, 6 Drawing Sheets

U.S. PATENT DOCUMENTS

| | | | | | |
|---|---|---|---|---|---|
| 4,486,676 | A * | 12/1984 | Moore et al. | .................. | 310/52 |
| 4,554,731 | A | 11/1985 | Borden | | |
| 4,970,483 | A * | 11/1990 | Wicker et al. | ............... | 505/211 |
| 6,194,807 | B1 * | 2/2001 | Kaminski et al. | ........... | 310/270 |
| 6,489,701 | B1 * | 12/2002 | Gamble et al. | .............. | 310/179 |
| 6,509,819 | B2 | 1/2003 | Snitchler et al. | | |
| 6,590,311 | B1 * | 7/2003 | Wang et al. | .............. | 310/261.1 |
| 6,711,421 | B2 * | 3/2004 | Wang et al. | ................. | 505/166 |
| 7,078,845 | B2 * | 7/2006 | Kaminski et al. | ........ | 310/261.1 |
| 7,211,919 | B2 * | 5/2007 | Kalsi et al. | ............ | 310/216.113 |
| 2003/0011253 | A1 * | 1/2003 | Kalsi et al. | .................... | 310/58 |
| 2004/0021391 | A1 * | 2/2004 | Jones et al. | ................. | 310/208 |

FOREIGN PATENT DOCUMENTS

| | | | |
|---|---|---|---|
| DE | 1 801 350 | A | 3/1970 |
| DE | 1 514 445 | A | 9/1970 |
| DE | 199 43 783 | A1 | 3/2001 |
| JP | 52-139955 | A | 11/1977 |

OTHER PUBLICATIONS

IEEE Trans. Appl. Supercond., vol. 9, No. 2, Jun. 1999, S. 293-296.

* cited by examiner

SADDLE-SHAPED COIL WINDING USING SUPERCONDUCTORS, AND METHOD FOR THE PRODUCTION THEREOF

CROSS REFERENCE TO RELATED APPLICATIONS

This application is based on and hereby claims priority to International Application PCT/EP2006/061640 filed Apr. 18, 2006, German Application No. 10 2005 018 370.0 filed on Apr. 20, 2005 and German Application No. 10 2006 009250.3 filed on Feb. 28, 2006, the contents of which are hereby incorporated by reference.

BACKGROUND

The invention relates to a saddle-shaped coil winding using superconductors on a tube outer surface with axially running straight winding sections and winding sections bent between them on opposite end faces, forming end windings. The invention also relates to a method for production of a coil winding such as this. A corresponding method for production of a coil winding such as this is disclosed in JP 06-196314 A.

In the field of superconduction technology, saddle-shaped coil windings have been provided for a long time in the field of high-power and particle physics, or electrical machines. In this case, the conductors that are used are generally composed of a traditional, metallic superconductor material with a low critical temperature $T_c$, so-called low-$T_c$ superconductor material (abbreviation: LTS material). This is because appropriate conductors can be bent relatively easily, and without any reduction in their superconducting characteristics, to the saddle shape with axially running, straight winding sections and with winding sections which are bent between them on opposite end faces and form end windings. Alternatively, their superconducting characteristics are formed or set, using the so-called “Wind and React” technique, only after final shaping of the conductors in the winding.

As is known, attempts have been made using oxidic superconductor materials with a high critical temperature $T_c$, the so-called high-$T_c$ superconductor material (abbreviation: HTS material) to produce corresponding windings with conductors composed of these materials, as well. JP 06-196314 A, which was cited initially, contains a proposal for this purpose. JP 2003-255032 A also mentions the option of using a conductor such as this for saddle-shaped coil windings. However, this results in the problem that, until now, it has been possible to produce conductors using materials such as these with an adequate current carrying capacity or critical current density $J_c$ only in strip form, although completed strip conductors are highly sensitive to strain, and therefore can be bent only to a very minor extent without the risk of reductions in their current carrying capacity or critical current density $I_c$. To a major extent, saddle-shaped coil windings have therefore not been produced using HTS conductors in the form of strips such as these, and so-called “racetrack coils” have been planned instead of this.

Racetrack coils are flat windings in which the turns always lie within a winding plane. If racetrack coils such as these are stacked one on top of the other, the stack therefore has no opening (so-called “aperture”) in the longitudinal direction. In rotating machines with a shaft running all the way through them, racetrack coils must therefore be fitted above and below a central area (see for example DE 199 43 783 A1). This therefore results in a free space, which is not occupied by the winding and leads to a corresponding reduction in the useful field strength, in the axially running straight winding sections of the coil winding. An aperture is created by the use of saddle coils, that is to say coil windings with end windings bent up at the ends. This is associated with more effective use of the superconducting windings, for example in rotating machines, provided that the superconductors can be deformed appropriately without any adverse effects on their superconducting characteristics.

Flat coil windings of the racetrack type for an HTS motor and the production of corresponding coil windings are also described, for example, in “IEEE Trans. Appl. Supercond.”, Vol. 9, No. 2, June 1999, pages 1197 to 1200.

Conically shaped coil windings with HTS conductors in the form of strips have also been proposed (see WO 01/08173 A1). In the case of this coil geometry, the winding is admittedly curved; however, in this case as well, the conductors of the individual turns on the straight sections and in the end winding areas are each located within a common plane. The flat faces of the conductors in this case lie parallel to the axis, which emerges at right angles from the coil winding.

Attempts are also known to produce saddle-shaped coil windings using HTS conductors in the form of strips (see “IEEE Trans. Appl. Supercond.”, Vol. 9, No. 2, June 1999, pages 293 to 296). The winding design described there allows only small apertures for a quadrupole magnet, however; however, apertures such as these are not sufficient for dipole windings, such as those which must be provided for two-pole rotor windings in machines.

A production method which is known for coil windings composed of strain-sensitive superconductors is based on the idea that the superconducting characteristics of the conductors of the coil winding are formed only after the winding process, in their final shape (so-called “Wind and React” technique; see for example EP 1 471 363 A1). However, this generally requires complex winding apparatuses, which are not very suitable for cost-effective production of coil windings for replacement in rotating machines.

SUMMARY

One potential object is therefore to specify a saddle-shaped coil winding with the features mentioned initially, in which the problems that have been described above are reduced. One particular aim is also to specify a production method which is suitable for production of non-planar coil windings using conductors in the form of strips which have already been prefabricated, such as high-$T_c$ superconductors which, in particular, are sensitive to strain.

The inventors propose that the saddle-shaped coil winding should accordingly be formed from flat coil shape of the racetrack type on a tube outer surface such that it has axially running winding sections on the longitudinal sides and winding sections which run between them at the end and form end windings, with the windings of the coil winding being formed with at least one superconductor in the form of a strip, whose narrow face faces the tube outer surface and each have a circumferential length in the saddle shape which is virtually unchanged from that in a flat coil shape, such that the at least one conductor in the form of a strip is arranged on the tube outer surface, in the turns in the area of the apex of the end winding sections with its flat face inclined through an inclination angle with respect to a normal on the outer surface in the direction of the winding center of the coil winding, with the inclination angle of an inner turn being less than that of an outer turn.

The advantages associated with this refinement of the coil winding are, in particular, that effective use of the field of the superconductor material can be achieved using already made strip conductors, since the straight parts of the winding lie in an area in which more power can be achieved using the same amount of strip conductor material. Furthermore, this allows the windings to be arranged in a compact form, so it is possible to achieve correspondingly smaller diameters for the area which forms the tube outer surface.

In particular, the coil winding is also distinguished in that its at least one conductor is arranged in the area of the end winding sections with its flat face inclined with respect to a normal on the outer surface in the direction of the winding center of the coil winding, in a particular manner. An alignment of the conductor such as this makes it possible to avoid the conductor being unacceptably overstrained during the forming of the winding.

For example, the coil winding can be formed particularly advantageously with any strain-sensitive superconductor in the form of a strip. A strain-sensitive superconductor in this context means any prefabricated superconductor which has been subjected to a strain or bending for construction of a saddle coil using known methods after its production, which strain or bending would lead to a noticeable deterioration in its superconducting characteristics, in particular its critical current density $I_c$, by at least 5% in comparison to the unstrained state. A risk of this type occurs in particular with the new oxide-ceramic high-$T_c$ superconductors. The coil winding can therefore preferably be formed using at least one high-$T_c$ superconductor with BPSCCO or YBCO material.

Instead of this, the at least one superconductor in the form of a strip can also be formed using $MgB_2$ superconductor material.

The at least one superconductor in the form of a strip for forming the coil winding may advantageously have an aspect ratio (width w/thickness d) of at least 3, and preferably at least 5. Superconductors such as these in particular now allow the production of coil windings with a pronounced saddle shape, without any need to be concerned about any adverse effect on their superconducting characteristics.

A tube with a circular or elliptical cross section, in particular a cylindrical outer surface (physically or fictionally) can be formed from the tubular outer surface.

In this case, the tube outer surface may be formed by a tubular body to which the winding is fitted. Instead of this, the coil winding can also be designed to be self-supporting. In the latter case, the tube outer surface is therefore only a fictional, imaginary surface.

If required, a tube with a curved axis (physically or fictionally) can also be formed from the tubular outer surface, without this leading to unacceptable overstraining of the conductor. This means that the measures are not restricted to saddle coil windings with straight side winding sections.

With respect to the avoidance of unacceptable strains/bending of the superconductor, provision is advantageously made for the respective circumferential length in the saddle shape to be less by at most 0.4%, and preferably by at most 0.3%, than that in the flat coil shape. Below this value, there is no need to be concerned about any degradation in the superconduction characteristics of the conductor.

In general, the coil winding has a radial height of at least 10% of the tube diameter, in order to have a pronounced saddle shape. The radial height is preferably at least 30% of the tube diameter.

The coil winding can preferably be arranged in a rotating machine or in a magnet for an accelerator, such as a gantry accelerator magnet, or may form a part of this apparatus. This is because these apparatuses in particular require a pronounced saddle shape.

The object relating to the production of the coil winding is achieved by the following operations, specifically, formation of the flat coil shape from the at least one prefabricated superconductor in the form of a strip, deformation to the tubular outer surface of a bending apparatus to form the saddle shape by pressing, fixing of the turns in the saddle shape.

The stated production method with the features of winding a flat coil winding followed by shaping to form a saddle coil winding is associated with the advantages that the flat winding technique can be carried out in a simple manner. Appropriate winding machines require only one rotation axis. In contrast, direct production of curved saddle coil windings would require more complex winding machines, with at least two rotation axes. The method therefore allows low-cost winding manufacture.

The method for production of a corresponding coil winding may advantageously additionally be configured as follows:

It is therefore possible to provide gaps between adjacent turns in the area of the end winding sections during the formation of the flat coil shape, such that during and after the deformation, this results in the virtually unchanged circumferential length of the individual turns.

In addition, spacers are introduced in order to produce the gaps between the adjacent turns for the formation of the flat coil shape, and are removed again before the deformation step. The use of spacers for the formation of the flat coil shape allows the circumferential lengths of the individual turns to be set such that their change during deformation to form saddle coils does not exceed the limit values mentioned above.

The turns are expediently encapsulated or adhesively bonded for fixing.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
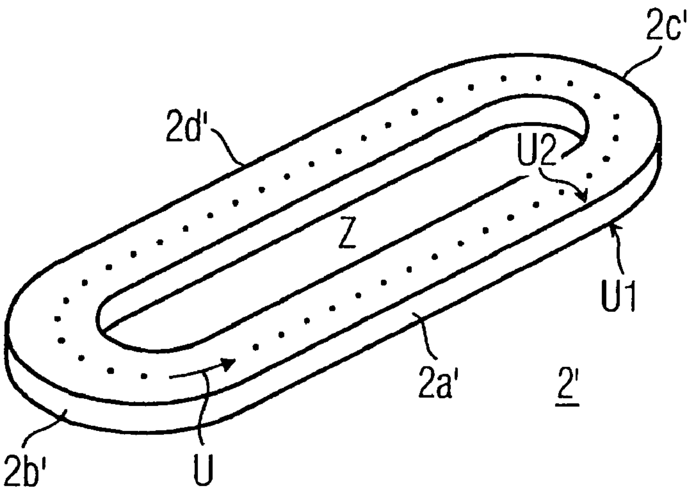
FIG. 1 shows an oblique view of a racetrack coil winding as an initial form for the proposed saddle coil windings.

Reference will now be made in detail to the preferred embodiments of the present invention, examples of which are illustrated in the accompanying drawings, wherein like reference numerals refer to like elements throughout.

In this case, corresponding parts are each provided with the same reference symbols in the figures.

The production of a saddle-shaped coil winding should be based on a planar or flat coil shape of the racetrack type. Appropriate coil shapes are generally known (see for example DE 199 43 783 A1); FIG. 1 shows one exemplary embodiment. The coil winding annotated 2' there has opposite longitudinal-side winding sections 2*a*' and 2*d*', as well as end, curved winding sections 2*b*' and 2*c*' running between them. The winding 2' is intended to be produced using one or more superconductors in the form of strips. The respective conductor in the form of a strip is wound upright, that is to say with its narrow face to the winding plane around a winding center Z, for example around a central winding core in order to form the coil winding. A circumferential length of the conductor within any given turn once running through 360° around the center Z or once through each of the two longitudinal-side winding sections 2*a*', 2*d*' and of the end winding sections 2*b*', 2*c*', is intended to be indicated in the figure by a dashed line annotated U. In this case, when using a strip conductor, the two edges of the strip each define a circumferential length U1 or U2. These two circumferential lengths are naturally the same in the case of a flat winding.

For simplicity, the following text refers only to the circumferential length U, although this always means the circumferential lengths U1 and U2 of the edges.

In principle, any superconductor material can be used as conductor material, in particular those which are sensitive to strain. For example the at least one superconductor in the form of a strip can thus be formed using $MgB_2$ superconductor material. One of the known HTS materials is chosen for the preferred exemplary embodiment. The winding 2' is therefore formed using one or more HTS conductors in the form of strips, in particular of the $(BiPb)_2Sr_2Ca_2CuO_x$ type (abbreviation: BPSCCO) or of the $YBa_2Cu_3O_x$ type (abbreviation: YBCO). In this case, the HTS conductors have a width w which is typically more than 3 mm, and is generally between 3 and 5 mm. Their thickness d is in this case very much less than the width w, and is typically less than 0.5 mm. It is preferable to use HTS conductors with an aspect ratio (width w/thickness d) of at least 3, and preferably at least 5.

Starting from the flat coil shape, the saddle coil winding is now formed with its two circumferential lengths U1 and U2 in the case of the three-dimensional coil winding shape having a difference of at most 0.4%, preferably of 0.3% or even better of 0.2%, length change with respect to the circumferential lengths of the flat coil, and also relative to one another. This difference is dependent on the respective superconductor design and the way in which its superconduction characteristics change during bending or straining. In consequence, it may even be below the stated value. This makes it possible to ensure that, even when seen over the entire circumference, local strain or compression of the strip conductor in comparison to a flat coil is at most 0.4%, preferably 0.3% or even better 0.2%. Since, as the inventors propose, the circumferential length U of the conductor in the individual turns is intended to remain virtually unchanged in comparison to the saddle coil winding to be formed from the flat racetrack coil winding, this results in a specific requirement for the individual circumferential lengths U of the racetrack coil winding. This means that, in the case of the coil winding, the circumferential lengths which must specifically be chosen for the conductor or conductors in the individual turns is predetermined by the corresponding length of the respective turn in the saddle shape, and the circumferential length is defined as a function of this for the individual turns in the flat racetrack coil shape. This means that the conductor turns in the area of the end winding sections 2*b*', 2*c*' in the racetrack coil shape must be located relatively loosely alongside one another, that is to say they must not be rigidly connected to one another.

Figure 2:
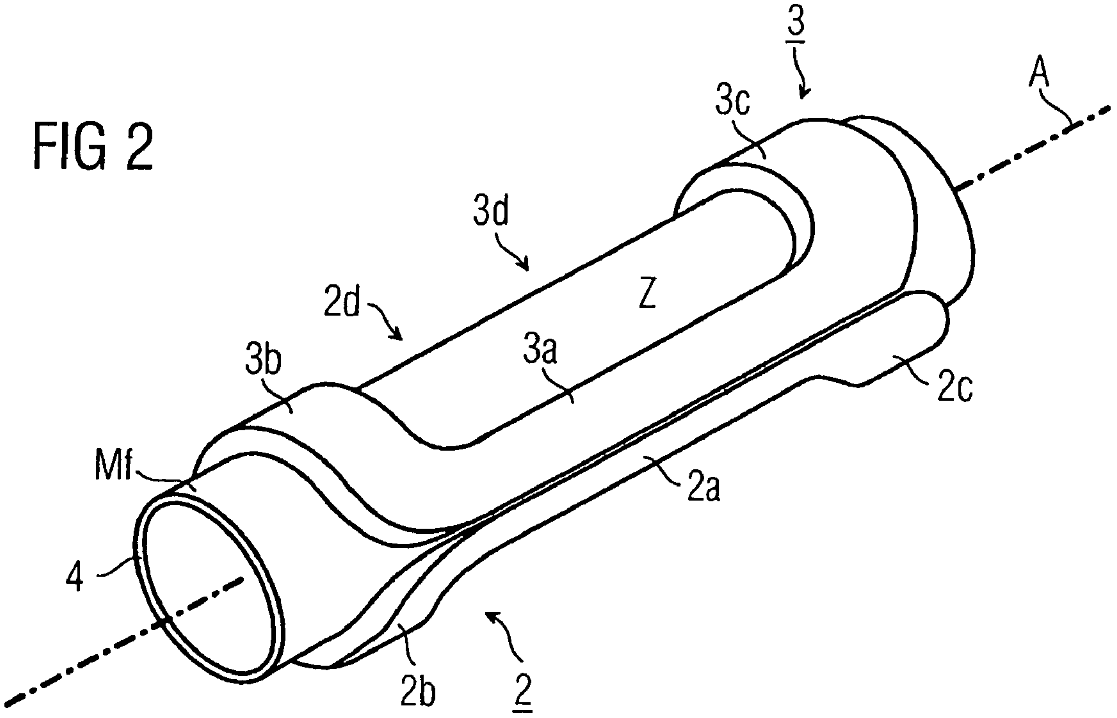
FIG. 2 shows an oblique view of an arrangement with two saddle coil windings in their final shape.

The arrangement shown in FIG. 2 with two saddle coils 2 and 3 in based on known embodiments of dipole magnets, such as those used for beam guidance magnets in accelerator installations for high-energy physics. A corresponding arrangement is also advantageous for a rotor in an electrical machine. The individual saddle-shaped coil windings are in this case located on a cylindrical outer surface Mf which, for example, is formed by a hollow cylinder 4. If no such hollow cylinder is used as the mount for the coil windings, the outer surface Mf should be regarded as only an “imaginary outer surface”. Each of the coil windings 2 and 3 in this case has straight winding sections 2*a*, 2*b* (which cannot be seen) as well as 3*a*, 3*d* (which cannot be seen) which run in the direction of the hollow-cylinder axis A, as well as bent winding sections 2*b*, 2*c* and 3*b*, 3*c*, which form end windings, at opposite ends.

Figure 3:
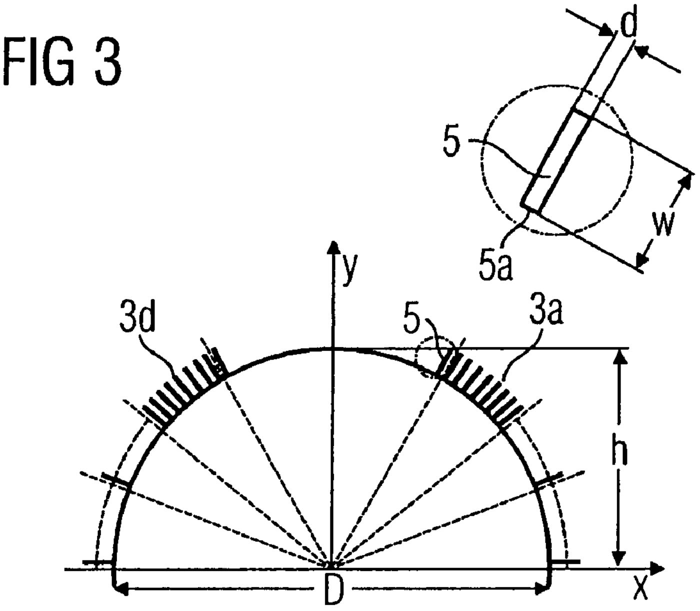
FIGS. 3 and 4 show a first embodiment of a proposed saddle coil winding, in the form of a cross-sectional and a longitudinal view, respectively.
Figure 4:
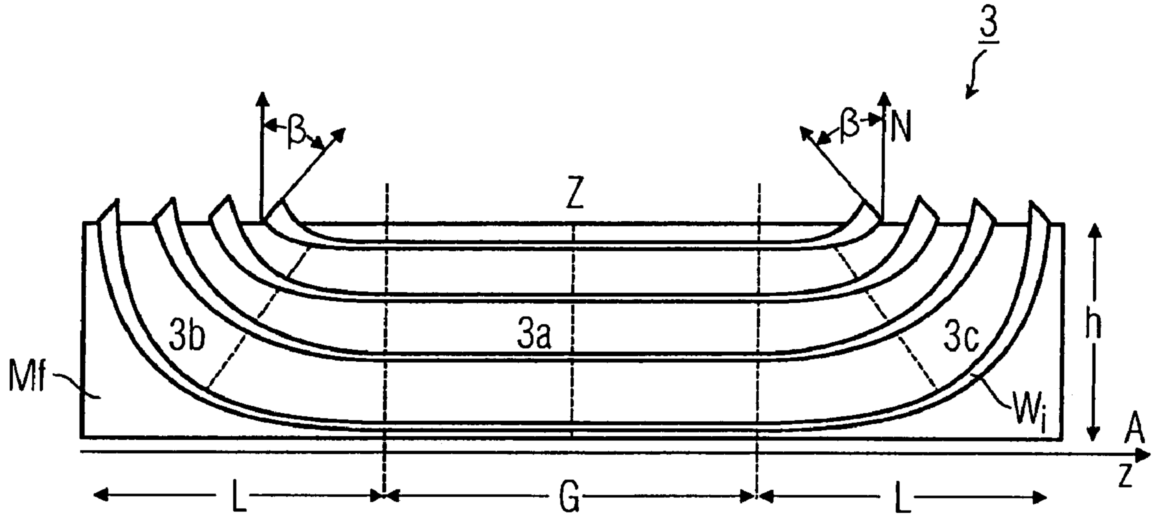
Figure 5:
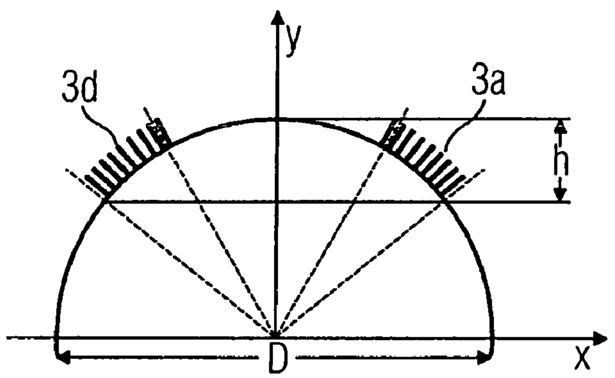
FIGS. 5 and 6 show an illustration corresponding to FIGS. 3 and 4 of a further embodiment of a coil winding such as this.
Figure 6:
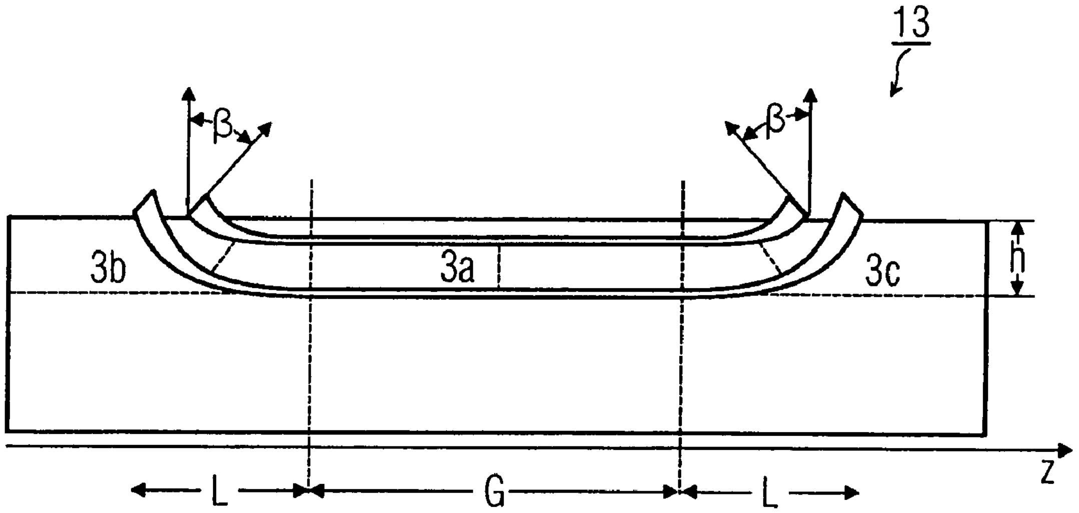

The following text describes variables relating to embodiments of saddle coil windings such as these, which result from FIGS. 3 to 7. By way of example, as shown in FIGS. 3 and 4, the selected coil winding 3 contains straight coil sections 3*a* with an axial length G, and three-dimensionally bent end windings in end winding sections 3*b* and 3*c*, each with an axial length L. In this case, the coil winding is located on a cylindrical outer surface Mf of diameter D. In this case, the embodiments shown in the Figure pairs 3, 4 and 5, 6 differ essentially in the height h of the saddle-shaped coil winding 3. The variable h in this case represents the maximum value by which the end windings project from the plane of the original racetrack coil winding, or from the plane of the longitudinal-side winding parts, before and after formation of the saddle shape. This value should in general be at least 10% of the diameter D of the tube with the tube outer surface Mf, and may, for example, be at least 40% of this amount. According to the exemplary embodiment shown in FIGS. 3 and 4, $h \approx ½ \cdot D$; this means that the winding is located with its outermost turns $W_i$ in the center, which is to say on the equator, of the cylindrical surface. In contrast, as shown in FIGS. 5 and 6, the cylindrical outer surface Mf with the conductors is wound with the saddle coil winding annotated 13 only to such an extent that its outermost turns $W_i$ are located above the equatorial plane of the cylinder. The radial winding height h in this case is accordingly less than D/2. A radial height h of at least 10% of the tube diameter D should preferably be chosen.

In the detail in the two Figure pairs 3, 4 and 5, 6, the HTS conductor in the form of a strip is annotated 5. This is used to create the respective saddle coil winding such that its narrow face 5*a* faces the cylindrical outer surface Mf, (see in particular FIGS. 3 and 5).

As is also evident from FIGS. 3 to 6, the individual HTS conductors at the apex point of the end winding sections 3*b*, 3*c* or of the end winding are not exactly vertical on the cylindrical outer surface Mf, but are inclined with respect to the normal N to this surface through an inclination angle β inwards towards the winding center Z. This is a consequence of the way in which the coil winding is formed.

The illustrated coil geometry is assumed to be associated with a right-angle x-y-z coordinate system, with the x-axis being directed in the equatorial plane, the y-axis at right angles to this, and the z-axis in the axial direction of the cylindrical outer surface (see FIGS. 3 and 4).

The following text quotes further statements relating to a mathematical description of an appropriate coil geometry:

The shape of the end windings results from the three-dimensional spatial curve of the strip conductor being defined such that a half ellipse (in the general case) or a semicircle (in the specific case of a half ellipse with two identical half-axes) is rolled onto the cylindrical surface of diameter D. The half ellipse is precisely the shape of the end winding of the flat coil before bending. This ensures compliance with the circumferential lengths.

For a conductor which is separated from the pole (direction of the y-axis) by an angle Θ in the straight parts, the first half-axis of the ellipse is:

$$a_i = \frac{\Theta \cdot D_i}{2}, \quad \text{(Equation 1)}$$

the second half-axis is then $b=L_i$ (in the special case of a half circle, a=b, that is to say $L_i=\Theta\cdot D_i/2$). In a general case, this can be expressed in the form:

$$b_i = L_i = e \cdot \frac{\Theta \cdot D_i}{2} \quad \text{(Equation 2)}$$

with the factor e describing the ratio of the two half-axes. This applies to the inner edge of the conductor (index "i"), which is located on the cylinder diameter $D_i$. The conductor length for the inner edge is therefore approximately:

$$L_i \approx \frac{\pi}{2} \cdot (a_i + b_i) = \frac{\pi}{2} \cdot \frac{\Theta \cdot D_i}{2} \cdot (1+e) \quad \text{(Equation 3)}$$

The outer edge of the same strip conductor (Index "a") is located on the straight pieces on the cylinder diameter $$D_a \approx D_i + 2w, \quad \text{(Equation 4)}$$

where w is the width of the strip conductor.

This larger cylinder diameter corresponds to a first half-axis of:

$$A_a = \frac{\Theta \cdot D_a}{2} \approx \frac{\Theta \cdot (D_i + 2w)}{2}. \quad \text{(Equation 5)}$$

With the same second half-axis ($b_a=b_i$) this would lead to the outer edge being longer than the inner edge, that is to say the strip conductor would have been unacceptably overstrained. The unacceptable strain is avoided by tilting or inclining the strip conductor through an angle β in words towards the winding center Z in the end winding. This shortens the second half-axis to:

$$b_a = L_a = b_i - w \cdot \sin\beta \quad \text{(Equation 6)}$$

The tilt or inclination angle β in this case is therefore set such that the outer edge is approximately no longer than the inner edge.

Ignoring the bending and torsional stiffnesses, the tilt angle calculated for this purpose is:

$$\beta_{theo} = \arccos\left[\frac{4-\Theta^2}{4+\Theta^2}\right] \quad \text{(Equation 7)}$$

Figure 7:
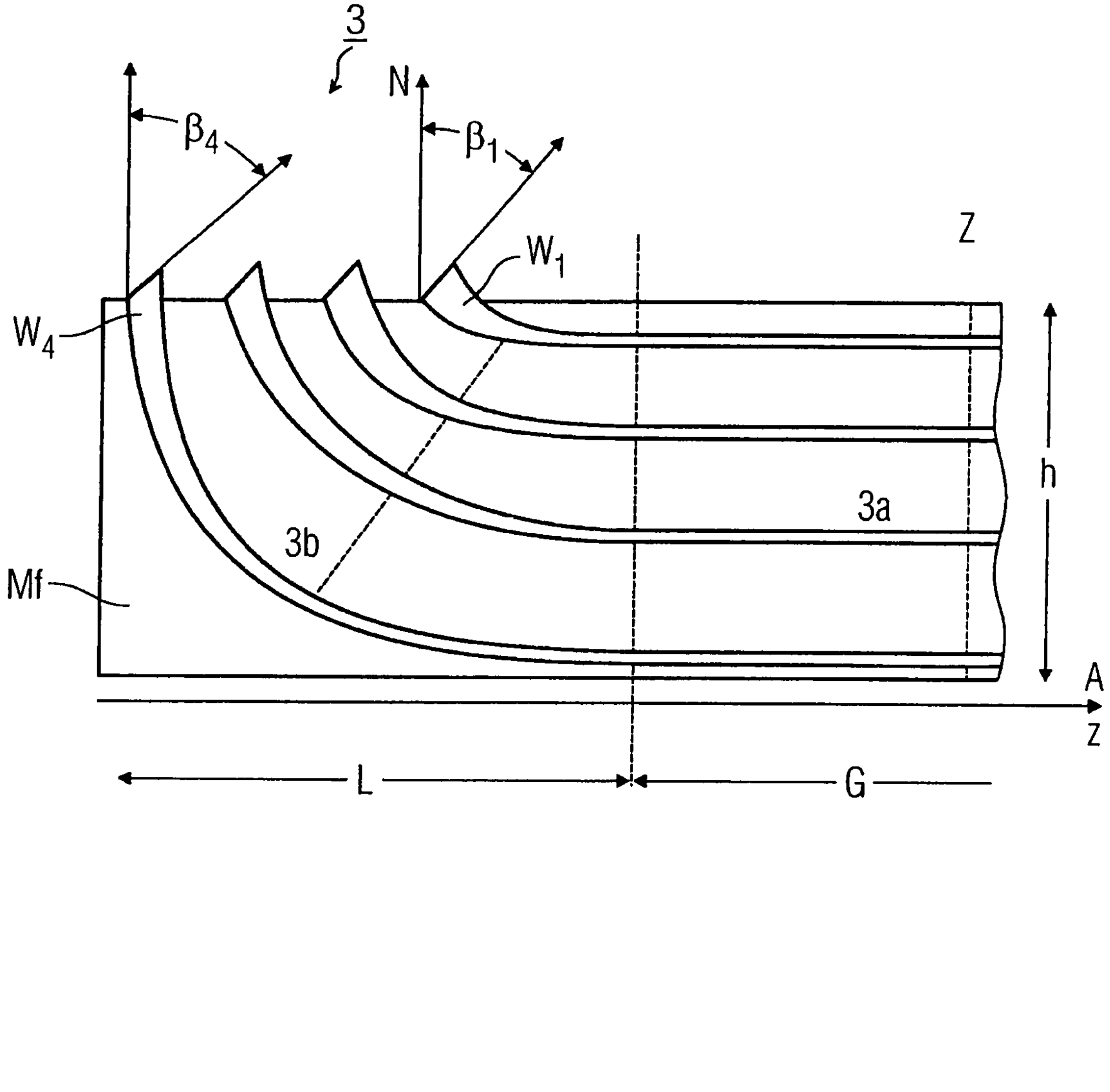
FIG. 7 shows an end winding of the saddle coil winding illustrated in FIG. 4, in the form of an enlarged view.

This means that the tilt or inclination angle β at the end windings changes from one turn to another, to be precise increasing slightly outwards from the center Z of the turn. This situation is shown in FIG. 7, which shows a detail of an end winding section or end winding 3*b* of the winding 3 illustrated in FIG. 4. For drawing reasons, the number of conductor turns $W_j$ illustrated is restricted, as in FIG. 4, to a total of "4" (where j=1 . . . 4) with the innermost conductor turn being annotated $W_1$ and the outermost being annotated $W_4$. In this case, the inclination angle $\beta_1$ of the inner conductor turn $W_1$ is less than the inclination angle $\beta_4$ of the outer conductor turn $W_4$ at the apex point of the end winding section 3*b*.

The tilt of the strip conductor is now achieved by twisting the conductor in the end winding along its longitudinal axis. This torsion occurs as an additional mechanical load, in addition to bending, on the conductor.

The bending and torsional stiffnesses of known HTS strip conductors can be taken into account with the aid of a correction factor k≈0.5 to 1.5—preferably k≈0.5 to 1.0. The calculated tilt angle is then:

$$\beta_{theo} = k \cdot \arccos\left[\frac{4-\Theta^2}{4+\Theta^2}\right] \quad \text{(Equation 8)}$$

Figure 8:
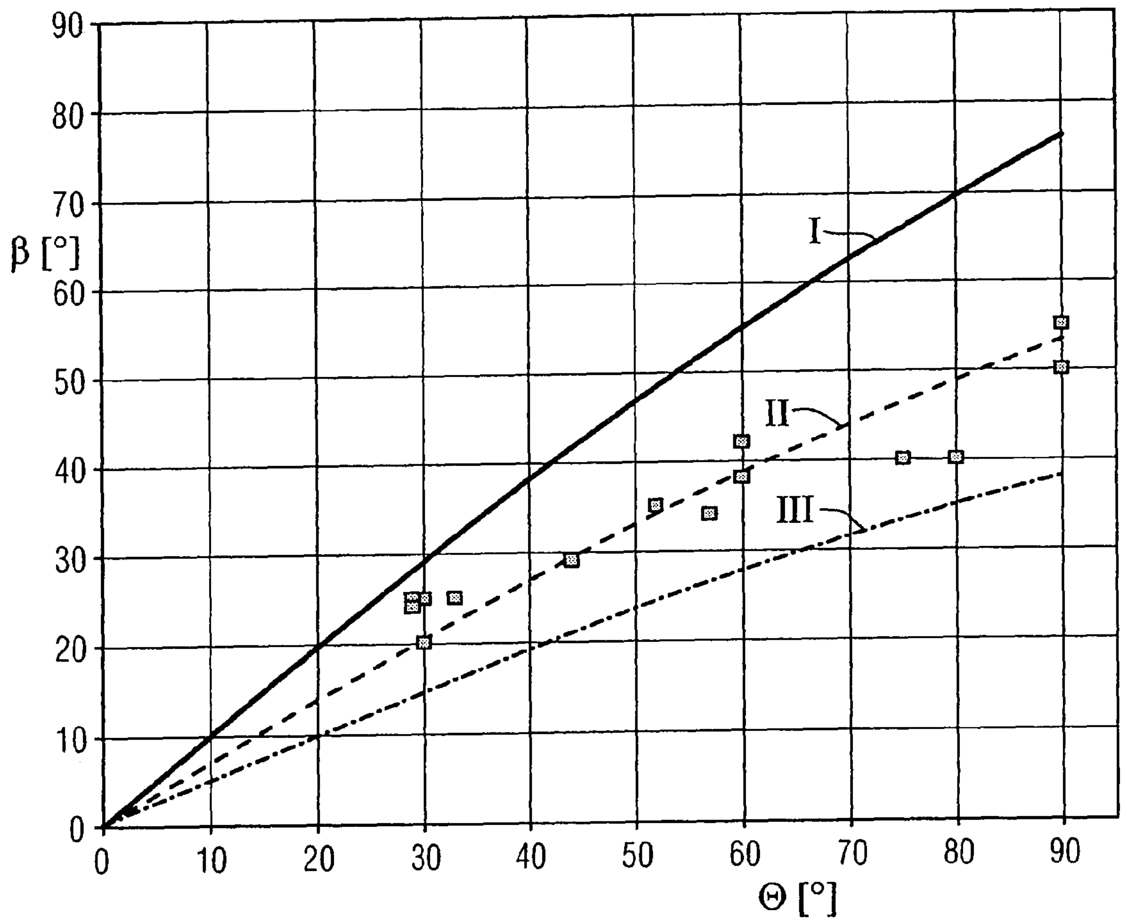
FIG. 8 shows a diagram of the relationship between the tilt angle of conductors in the end winding as shown in FIG. 7 and the pole angle.

FIG. 8 uses a graph to show the tilt angle $\beta_{theo}$ calculated using equation 8 and the tilt angle β, measured on various saddle coil windings, in each case as a function of the pole angle Θ. In this case, the solid line I shows the calculation using a correction factor of k=1, the dashed line II shows the calculation using a corrector factor of k=0.7, and the dashed-dotted line III shows the calculation using a correction factor of k=0.5. The measured values are plotted as square dots ■.

The geometric design of the coil winding (cylinder diameter D, pole angle Θ for the turns, half-axis ratio e) is in this case produced such that the respective conductor-specific limit loads critical radius of curvature $R_c$ or curvature strain $\epsilon_{cR}$ critical torsion $\theta_c$ and torsional strain $\epsilon_{c\Theta}$ are not exceeded.

The following limit loads are quoted as examples for a commercial BPSCCO conductor:

critical bending load: $R_c\approx 3$ cm and $\epsilon_c\approx 0.4\%$ critical torsional load: $\theta_c\approx 2500°/\text{m}$ and $\epsilon_{c\Theta}\approx 0.2\%$.

Based on an appropriate coil geometry, a saddle-shaped coil winding has the following characteristic properties:

- The three-dimensional curvature of the end windings is achieved by bending the strip conductors for the flat edge (so-called "good" bending direction) and torsion of the conductor along the conductor axis.
- The locally occurring bending radii and torsions are within the critical load limits, beyond which irreversiblse damage occurs to the superconducting characteristics.
- All the turns $W_i$ of the coil winding in the end windings are above a specific minimum height h, thus resulting in a large aperture. The height h depends on the winding degree of the coil winding (see the differences between the figure pairs 3, 4 and 5, 6).

In the straight sections of the winding, the flat faces of the strip conductors lie approximately in the radial direction with respect to the cylindrical shape of the coil winding.

In the end windings, the strip conductors have a certain inclination through an angle β inwards (see FIGS. 3 to 7). This inclination varies for the different turns. This inclination results in the "outer edge" of the strip conductor not being unacceptably strained in comparison to the "inner edge" of the strip conductor, which would once again lead to irreversible damage to the superconducting characteristics.

On their path over the end winding, the HTS strips of the individual turns describe a three-dimensional spatial curve. This three-dimensional spatial curve is defined for the inner edge by a half-ellipse (in the general case) or a half-circle (in a specific case) being rolled onto the cylinder surface.

Figure 9:
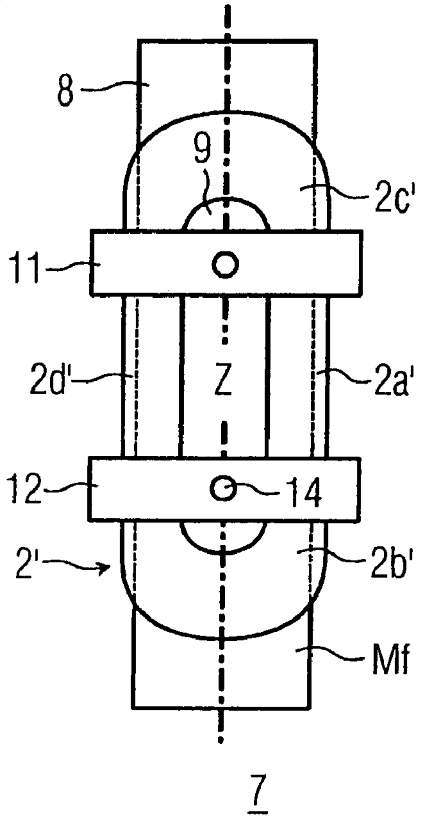
FIGS. 9 and 10 show a bending apparatus for production of a proposed saddle coil winding, in the form of a plan view and a cross section, respectively.
Figure 10:
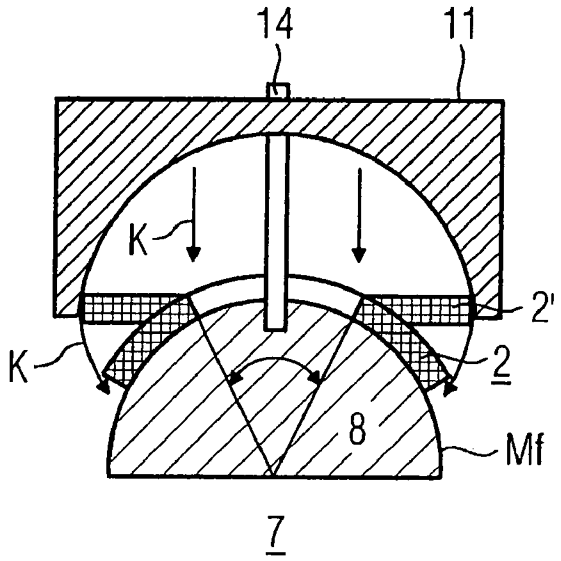

The following method with the individual operations 1 to 5 can advantageously be used to produce the saddle coil winding as described above:

1. In a first step, a flat racetrack coil winding is wound first of all. The winding process is carried out "dry", that is to say without encapsulation material being added. In this case, spacers (for example flexible sheets) with a thickness A can be introduced between the turns in the end windings, as required. The object of these spacers is to deliberately set the increase in the wire length from one turn to the next. If the radius of an inner first turn is R, then the conductor length in a 90° arc is $L_1=\pi\cdot R$. If a second turn is now wound onto this first turn and a spacer of thickness D is inserted, then the length of the second turn is now $L_2=\pi\cdot(R+\Delta+d)$. The change in length between the turns is therefore $L_2-L_1=\pi(\Delta+d)$. The spacers therefore allow the change in length to be set deliberately, for a given thickness d of the strip conductors.
2. In a second step, the coil winding is removed from the winding machine, and is placed in a bending apparatus. The bending apparatus is shown in FIGS. 9 and 10, and is annotated, in general, 7. It has a bending cylinder 8 with a pole piece 9 on which the flat coil winding 2' is first of all placed, as well as dies 11, 12, which are matched to the shape of the outer surface Mf of the bending cylinder, in order to form the coil winding 2. Before bending, the spacers are first of all removed from the end windings.
3. In a third step, the dies are now lowered onto the flat coil winding 2'. The dies now deform the initially flat coil winding, and press it onto the surface of the bending cylinder, by bending forces K. This results in the desired saddle-shaped coil geometry.
4. In a fourth step, the coil winding must now be fixed in its bent shape. This can be done, for example, by encapsulation of the coil winding. In order to prevent adhesive bonding of the coil winding in the bending apparatus, the surface of the bending apparatus is composed, for example, of Teflon, which is not joined to encapsulation materials. Alternatively, the coil winding could also be fixed by suitably shaped auxiliary tools which, for example, are clamped or adhesively bonded to the coil winding. This would make it possible, for example, to carry out encapsulation later, outside the bending apparatus.
5. Finally, the coil winding can be removed from the bending apparatus.

When a saddle coil winding had been encapsulated, using this method, with a known BPSCCO strip material, from the flat disk coil winding to completion, and had been removed from the bending apparatus, it was not possible to find any damage to the conductor.

This method can likewise be used well for production of a saddle-shaped coil winding with coated YBCO conductors, as well. It is also possible for the technology to be applied to assembled composite conductors, in particular of the interposed conductor type, if larger coil windings are required.

The above exemplary embodiments have been based on the assumption that the saddle coil winding is located on a possibly only imaginary outer surface Mf of an elongated hollow cylinder, for example of the rotor of an electrical machine such as a motor or generator. It may also be the outer surface of a magnet, for example for high-energy physics. The configuration of a saddle coil winding and its production method are, however, not necessarily restricted to a corresponding shape of the outer surface. For example, cross-sectional shapes other than the exact circular shape of the cross section of a hollow cylinder are likewise equally possible, for example a more elliptical cross-sectional shape, without this having to lead to unacceptable overstraining of the superconductor. It is also not essential for the axis A of the tube with the outer surface Mf to be straight. Specifically, a tubular shape with a curved axis is also known, which can be provided with saddle coil windings which can be made. By way of example, curved coil windings are used for certain accelerator magnets, for example magnets for so-called "gantries" of accelerators for cancer therapy. In this case, the longitudinal-side winding sections which have been assumed to be straight for the present exemplary embodiments are bent in the coil plane in order to allow the particle beam to travel on a circular path. This means that the axis A of the tubular outer surface to which the saddle coil winding is fitted can likewise also be curved.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A saddle-shaped coil winding which is formed from a flat coil shape of the racetrack type on a tube outer surface, the coil winding comprising:

axially running winding sections on longitudinal sides;

end winding sections which run between ends of the axially running winding sections, the end winding sections forming end windings with the windings of the coil winding;

the coil winding being formed with at least one superconductor in the form of a strip, the strip having a flat face and a narrow face, the narrow face facing the tube outer surface;

the coil winding having a circumferential length in the saddle shape which is substantially equal to that in the flat coil shape;

wherein the at least one superconductor is in the form of a strip and has at least two turns arranged on the tube outer surface in an area of an apex of the end winding sections, such that there is at least an inner turn and an outer turn at each end winding section;

wherein one flat face of each superconductor strip is inclined through an inclination angle with respect to a normal of the tube outer surface in a direction of a winding center of the coil winding; and wherein an inclination angle of the outer face for the inner turn is less than an inclination angle of the outer turn.

2. The coil winding as claimed in claim 1, wherein the superconductor comprises at least one strain-sensitive superconductor in the form of a strip.

3. The coil winding as claimed in claim 1, wherein the at least one superconductor in the form of a strip is formed using high critical temperature superconductor material.

4. The coil winding as claimed in claim 3, wherein the at least one high critical temperature superconductor is formed using BPSCCO or YBCO material.

5. The coil winding as claimed in claim 1, wherein the at least one superconductor in the form of a strip is formed using $MgB_2$ superconductor material.

6. The coil winding as claimed in claim 1, wherein the at least one superconductor in the form of a strip has an aspect ratio (width w/thickness d) of at least 3, and preferably at least 5.

7. The coil winding as claimed in claim 1, wherein a tube with a circular or elliptical cross section is formed from the tube outer surface.

8. The coil winding as claimed in claim 1, wherein the tube outer surface is a cylindrical outer surface.

9. The coil winding as claimed in claim 1, wherein a tube with a curved axis is formed from the tube outer surface.

10. The coil winding as claimed in claim 1, wherein the tube outer surface is formed by a tubular body to which the winding is fitted.

11. The coil winding as claimed in claim 1, wherein the respective circumferential length in the saddle shape is less by at most 0.4%, and preferably by at most 0.3%, than that in the flat coil shape.

12. The coil winding as claimed in claim 1, wherein a radial height of the coil winding is at least 10% of the tube diameter (D).

13. The coil winding as claimed in claim 12, wherein a radial height of the coil winding is at least 30% of the tube diameter.

14. The coil winding as claimed in claim 1, wherein the coil winding is arranged in a rotating machine, a magnet of an accelerator, or a gantry accelerator magnet.

15. A method for production of a coil winding, comprising:

forming a flat coil shape from at least one prefabricated superconductor in the form of a strip;

deforming the strip on a tubular outer surface of a bending apparatus to form the saddle shape by means of pressing;

arranging the at least one superconductor in the form of a strip having at least two turns on the tube outer surface in an area of an apex of the end winding sections, such that there is at least an inner turn and an outer turn at each end winding section;

inclining one flat face of each superconductor strip through an inclination angle with respect to a normal of the tube outer surface in a direction of a winding center of the coil winding; and wherein an inclination angle of the outer face for the inner turn is less than an inclination angle of the outer turn.

16. The method as claimed in claim 15, comprising further:

providing gaps between adjacent turns in the area of the end winding sections during the formation of the flat coil shape, such that, during and after the deformation, this results in the virtually unchanged circumferential length of the individual turns.

17. The method as claimed in claim 15, further comprising:

encapsulating the turns for fixing.

18. The method as claimed in claim 15, further comprising:

adhesively bonding the turns for fixing.

19. The coil winding as claimed in claim 3, wherein the at least one superconductor in the form of a strip has an aspect ratio (width w/thickness d) of at least 3, and preferably at least 5.

20. The coil winding as claimed in claim 19, wherein a tube with a circular or elliptical cross section is formed from the tube outer surface.

21. The coil winding as claimed in claim 20, wherein a tube with a curved axis is formed from the tube outer surface.

22. The coil winding as claimed in claim 21, wherein the respective circumferential length in the saddle shape is less by at most 0.4%, and preferably by at most 0.3%, than that in the flat coil shape.

23. The coil winding as claimed in claim 22, wherein a radial height of the coil winding is at least 10% of the tube diameter (D).

* * * * *